(12) United States Patent
Nagano et al.

(10) Patent No.: US 10,637,525 B2
(45) Date of Patent: Apr. 28, 2020

(54) WIRELESS DEVICE AND WIRELESS COMMUNICATION METHOD

(71) Applicant: HITACHI KOKUSAI ELECTRIC INC., Tokyo (JP)

(72) Inventors: Terufumi Nagano, Tokyo (JP); Hideaki Shimizu, Tokyo (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 0 days.

(21) Appl. No.: 16/480,587

(22) PCT Filed: Jan. 25, 2018

(86) PCT No.: PCT/JP2018/002243
§ 371 (c)(1),
(2) Date: Jul. 24, 2019

(87) PCT Pub. No.: WO2018/143043
PCT Pub. Date: Sep. 8, 2018

(65) Prior Publication Data
US 2019/0393922 A1    Dec. 26, 2019

(30) Foreign Application Priority Data

Feb. 6, 2017    (JP) .................................. 2017-019375

(51) Int. Cl.
*H04B 1/40* (2015.01)
*H04B 1/10* (2006.01)
(Continued)

(52) U.S. Cl.
CPC ............... *H04B 1/401* (2013.01); *H03F 1/32* (2013.01); *H04B 1/006* (2013.01); *H04B 1/406* (2013.01);
(Continued)

(58) Field of Classification Search
CPC ........ H04B 1/401; H04B 1/006; H04B 1/406; H04B 1/48; H04B 1/50; H04B 7/2621;
(Continued)

(56) References Cited

U.S. PATENT DOCUMENTS 7,142,884 B2    11/2006  Hagn
8,805,298 B2 *   8/2014  McCallister ........... H04B 1/525
                                                          375/219
(Continued)

FOREIGN PATENT DOCUMENTS

JP    2002-152079 A    5/2002
JP    2002-171194 A    6/2002
(Continued)

OTHER PUBLICATIONS

International Search Report dated Apr. 17, 2018.

*Primary Examiner* — Pablo N Tran
(74) *Attorney, Agent, or Firm* — Bacon & Thomas, PLLC

(57) ABSTRACT

There is provided a wireless device capable of supporting both of TDD and FDD wireless communications with a simple configuration. The wireless device includes a transmitter that transmits a signal of a first frequency; a DPD receiver that receives signals of the first frequency; a receiver that receives signals of a second frequency; a duplexer having a first filter having passband characteristics in the first frequency band and a second filter having passband characteristics in the second frequency band; and a circulator that splits the signal from the transmitter to output the split signals to the duplexer and the DPD receiver, and outputs a reception signal from the duplexer to the DPD receiver. The duplexer is connected to the circulator on the first filter side and to the receiver on the second filter side, and uses the DPD receiver for FDD and TDD transmission feedback and for TDD reception.

4 Claims, 3 Drawing Sheets

(51) Int. Cl.
*H03F 1/02* (2006.01)
*H03F 1/32* (2006.01)
*H04B 1/401* (2015.01)
*H04B 1/00* (2006.01)
*H04B 1/403* (2015.01)
*H04B 1/48* (2006.01)
*H04B 1/50* (2006.01)
*H04B 7/26* (2006.01)

(52) U.S. Cl.
CPC ............... *H04B 1/48* (2013.01); *H04B 1/50* (2013.01); *H04B 7/2621* (2013.01); *H04B 7/2643* (2013.01)

(58) Field of Classification Search
CPC .......... H04B 7/2643; H04B 1/44; H04B 1/00; H04B 1/10; H04B 1/12; H04B 1/525; H04B 1/40; H03F 1/32; H03F 1/02; H03F 3/19; H03F 3/24; H03F 3/72
See application file for complete search history.

(56) References Cited

U.S. PATENT DOCUMENTS

| | | | |
|---|---|---|---|
| 8,862,081 B2* | 10/2014 | Sutton | H04B 7/0845 |
| | | | 455/135 |
| 8,971,828 B2 | 3/2015 | Zhou et al. | |
| 9,748,906 B2* | 8/2017 | Stewart | H03F 1/3247 |
| 9,762,268 B2* | 9/2017 | Yang | H04B 1/0007 |
| 9,814,053 B2* | 11/2017 | Wang | H03F 1/0277 |
| 9,831,900 B2* | 11/2017 | Okawa | H04B 1/0475 |
| 10,044,375 B2* | 8/2018 | Pham | H04B 1/0483 |
| 10,298,349 B2* | 5/2019 | Gao | H04B 1/48 |
| 10,516,209 B2* | 12/2019 | Noto | H01Q 3/2617 |
| 2019/0238175 A1* | 8/2019 | Su | H04B 1/54 |

FOREIGN PATENT DOCUMENTS

| | | |
|---|---|---|
| JP | 2002-185356 A | 6/2002 |
| JP | 2008-306370 A | 12/2008 |
| JP | 2012-175708 A | 9/2012 |
| JP | 2013-58910 A | 3/2013 |
| WO | WO2015/190085 A | 12/2015 |

* cited by examiner

WIRELESS DEVICE AND WIRELESS COMMUNICATION METHOD

TECHNICAL FIELD

The present invention relates to a time-division duplex (TDD) wireless communication system and a frequency-division duplex (FDD) wireless communication system.

BACKGROUND

Conventionally, an FDD wireless communication system using different frequencies for transmission and reception and a TDD wireless communication system using the same frequency for transmission and reception have been practically used.

In order to effectively use frequencies, in a frequency band of quasi-millimeter or higher waves, the FDD wireless communication system and the TDD wireless communication system are used in close frequency bands. However, in the conventional techniques, the coexistence of a TDD wireless device associated with the TDD wireless communication system and an FDD wireless device associated with the FDD wireless communication system is difficult to be realized due to the difference in filter configurations between an antenna and the wireless devices.

This is because the TDD wireless device has the filter pass characteristic that the transmission frequency and the reception frequency are the same while the FDD wireless device has the filter pass characteristic that the transmission frequency and the reception frequency are different from each other so that a duplexer is utilized to branch and separate the frequencies. Even assuming that a common TDD/FDD wireless device is realized, RF line routing would be complicated and RF switches would be used extensively to avoid the provision of the duplexers, increasing power consumption or degrading reception characteristics. Therefore, it is necessary to sacrifice any one of the wireless communication systems.

As described above, it is difficult to provide a single wireless device compatible with both FDD and TDD wireless communication systems, and the wireless device has been scaled up and become more expensive since the wireless device is to be installed in each system even though the baseband unit can be shared.

For the above reasons, in practical use, separate wireless devices have been used in the TDD wireless communication system and the FDD wireless communication system.

As an example of the conventional techniques relating to a common device used for both a FDD scheme and a TDD scheme, there has been proposed a distortion compensation device that is compatible with both the FDD scheme and the TDD scheme and implements a delay adjustment precisely reflecting an effective data period (see, e.g., Patent Document 1).

Patent Document 1: Japanese Patent Application Publication No. 2013-58910

SUMMARY

In view of the above, the present invention provides a wireless device, as a single device, capable of supporting both TDD wireless communications and FDD wireless communications with a simple configuration.

In accordance with an embodiment of the present invention, there is provided a wireless device compatible with both FDD wireless communications in which transmission is performed with a first frequency while reception is performed with a second frequency and TDD wireless communications in which transmission and reception are performed with the first frequency, the wireless device including: a transmission circuit unit configured to transmit a signal having the first frequency; a first reception circuit unit configured to receive a signal having the first frequency; a second reception circuit unit configured to receive a signal having the second frequency; a branching unit connected to an antenna and having a first filter having passband characteristics in a frequency band of the first frequency and a second filter having passband characteristics in a frequency band of the second frequency; and a path switching unit configured to split the signal from the transmission circuit unit to output the split signals to the branching unit and the first reception circuit unit and further configured to output a reception signal from the branching unit to the first reception circuit unit. The branching unit is connected to the path switching unit through the first filter and is also connected to the second reception circuit unit through the second filter, and the branching unit uses the first reception circuit unit for a feedback of the transmission in TDD wireless communications and FDD wireless communications and for the reception in TDD wireless communications.

In the wireless device described above, it is possible to provide one common circuit unit for the feedback of the transmission in TDD wireless communications and FDD wireless communications and for the reception in TDD wireless communications. Therefore, it is possible to implement a single wireless device capable of supporting both TDD wireless communications and FDD wireless communications with a simple configuration.

Further, the first reception circuit unit may include a first front-end amplifier, a first front-end filter having passband characteristics in the frequency band of the first frequency, a first back-end filter having passband characteristics in a frequency band for distortion compensation, and a first back-end amplifier. The second reception circuit unit may include a second front-end amplifier, a second front-end filter having passband characteristic in the frequency band of the second frequency, a second back-end filter having passband characteristics in a frequency band for the reception, and a second back-end amplifier. The split signal obtained by splitting the signal outputted from the transmission circuit unit to the first reception circuit unit may be processed by the first front-end filter and, then, processed by the first back-end filter and the first back-end amplifier. The received signal having the first frequency may be processed by the first front-end amplifier and the first front-end filter and, then, processed by the second back-end filter and the second back-end amplifier. The received signal having the second frequency may be processed by the second front-end amplifier and the second front-end filter and, then, processed by the second back-end filter and the second back-end amplifier.

With such configuration, it is possible to realize a compact and high-efficiency wireless device capable of suppressing deterioration of the wireless communications characteristics in both TDD wireless communications and FDD wireless communications.

Effect

In accordance with the present invention, it becomes possible to provide the wireless device, as a single device, capable of supporting both TDD wireless communications and FDD wireless communications with a simple configuration.

DETAILED DESCRIPTION

A wireless device according to the present invention will be described with reference to the drawings.

The wireless device according to the present invention is schematically configured as a distortion-compensated wireless device for transmission DPD (digital predistortion) compatible with a FDD wireless communication system, the wireless device including a circulator provided between a transmission output and a duplexer to extract a feedback signal for the transmission DPD. Since non-linear distortion generated by a transmission amplifier significantly degrades the communication quality of the multi-level quadrature amplitude demodulation (QAM), a method for canceling the non-linear distortion by performing a DPD signal processing and a signal processing for suppressing a peak voltage of a signal is generally used in wireless base stations.

Figure 1:
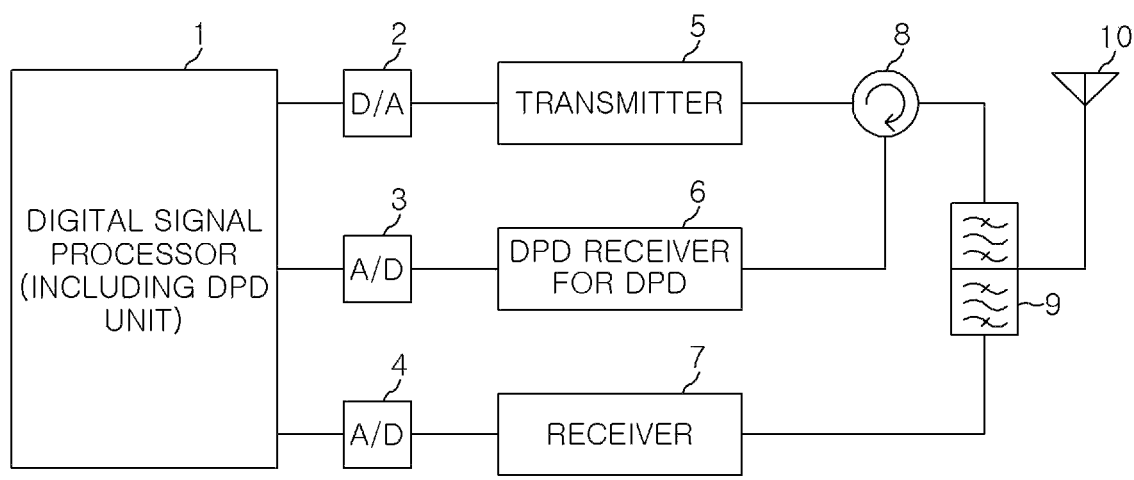
FIG. 1 shows an example of a configuration of a wireless device according to a first embodiment of the present invention.

FIG. 1 shows an example of a configuration of a wireless device according to a first embodiment of the present invention.

The wireless device of the first embodiment includes a digital signal processor (including a digital predistortion (DPD) unit) 1, a transmission system having a digital-to-analog (DA) converter 2 and a transmitter 5, a first reception system having an analog-to-digital (AD) converter 3 and a DPD receiver 6 for digital predistortion, a second reception system having an AD converter 4 and a receiver 7, a circulator 8, a duplexer 9, and an antenna 10.

The wireless device is configured to support wireless communications in both TDD and FDD wireless communication systems. In the wireless device, one of a TDD scheme and a FDD scheme is selected by a mode setting determined in advance. Alternatively, the user may appropriately select one of the TDD scheme and the FDD scheme by a switch operation or the like.

Here, in FDD wireless communications, a frequency f1 is used for transmission while a frequency f2 is used for reception. Further, in TDD wireless communications, the frequency f1 is used for transmission and reception.

The circulator 8 has a first port connected to the transmitter 5, a second port connected to the duplexer 9, and a third port connected to the DPD receiver 6.

A transmission signal inputted from the transmitter 5 to the first port is outputted to the duplexer 9 through the second port. Further, a reception signal inputted from the duplexer 9 to the second port is outputted to the DPD receiver 6 through the third port. Further, the transmission signal inputted to the first port is not entirely outputted through the second port, and a part of the transmission signal leaks to the third port. In other words, a part of the transmission signal inputted to the first port is attenuated through the third port that is an isolated port and is outputted as a feedback signal to the DPD receiver 6.

The duplexer 9 includes a first filter and a second filter. The first filter and the second filter have different frequency characteristics in that passband and stopband thereof are different from each other. The duplexer 9 is provided between the circulator 8, the receiver 7 and the antenna 10. The first filter has passband characteristics in a frequency band of the frequency f1 and has stopband characteristics in a frequency band of the frequency f2. Further, the first filter is connected to the circulator 8. In contrary to the first filter, the second filter has passband characteristics in a frequency band of the frequency f2 and has stopband characteristics in a frequency band of the frequency f1. Further, the second filter is connected to the receiver 7.

Specifically, the transmission signal having the frequency f1 inputted from the transmitter 5 through the circulator 8 is outputted to the antenna 10 through the first filter. Further, in the case of the TDD scheme, since the frequency f1 is used for the reception, a reception signal inputted from the antenna 10 passes through the first filter and is outputted to the DPD receiver 6 through the circulator 8. On the other hand, in the case of the FDD scheme, since the frequency f2 is used for the reception, a reception signal inputted from the antenna 10 passes through the second filter and is outputted to the receiver 7.

First, the transmission and reception operation of the FDD scheme by using the wireless device according to the present embodiment will be described in detail.

A transmission modulation signal generated by the digital signal processor 1 is converted to an analog signal by the DA converter 2, and then the converted analog signal is up-converted by the transmitter 5 to a desired frequency (frequency f1). Then, the up-converted signal is amplified to thereby obtain a required power.

A part of the output signal of the transmitter 5 is attenuated through the third port (isolated port) of the circulator 8 and is outputted as a feedback signal to the DPD receiver 6. The feedback signal inputted to the DPD receiver 6 is frequency down-converted, amplified, and then converted to a digital signal by the AD converter 3 in the back end. The converted digital signal is fed back to the digital signal processor 1.

The digital signal processor 1 controls the DPD unit provided therein to generate a transmission modulation signal having the inverse characteristics of AM/AM (amplitude/amplitude) characteristics and AM/PM (amplitude/phase) characteristics based on the feedback signal fed back through the DPD receiver 6.

As a result, it is possible to generate the transmission modulation signal in which non-linear distortion generated due to power amplification in the transmitter 5 is canceled, and the transmission modulation signal thus generated passes through the circulator 8 and the duplexer 9 and is wirelessly transmitted from the antenna 10.

Meanwhile, since the reception signal inputted from the antenna 10 has the frequency f2 that differs from the transmission frequency, the reception signal is branched to the path different from that of the transmission signal through the duplexer 9 and is outputted to the receiver 7. The reception signal inputted to the receiver 7 is amplified, frequency down-converted, amplified and converted to a digital signal by the AD converter 4 in the back end. Then, the converted digital signal is outputted to the digital signal processor 1.

The digital signal processor 1 processes each reception signal inputted through the receiver 7.

Further, in the case where the wireless device is operated in the FDD scheme, the DPD receiver 6 may be turned off to achieve the lower power consumption if the communication quality can be maintained at a low output transmission or even when the DPD unit is not operated by the low output transmitter.

Next, the transmission and reception operation of the TDD scheme by using the wireless device according to the present embodiment will be described in detail.

A time-division transmission modulation signal generated by the digital signal processor 1 is converted to an analog signal by the DA converter 2, and then the converted analog signal is up-converted to a desired frequency (frequency f1) by the transmitter 5. Then, the up-converted signal is amplified to thereby obtain a required power. During the time when there is no transmission data, the amplifier used for power amplification may be turned off to reduce deterioration of the reception characteristics.

A part of the output signal of the transmitter 5 is attenuated through the third port (isolated port) of the circulator 8 and is outputted as a feedback signal to the DPD receiver 6. The feedback signal inputted to the DPD receiver 6 is frequency down-converted, amplified, and then converted to a digital signal by the AD converter 3 in the back end. The converted digital signal is fed back to the digital signal processor 1.

The digital signal processor 1 controls the DPD unit provided therein to generate a transmission modulation signal having the inverse characteristics of AM/AM (amplitude/amplitude) characteristics and AM/PM (amplitude/phase) characteristics based on the feedback signal fed back through the DPD receiver 6.

As a result, it is possible to generate the transmission modulation signal in which non-linear distortion generated due to power amplification in the transmitter 5 is canceled, and the transmission modulation signal thus generated passes through the circulator 8 and the duplexer 9 and is wirelessly transmitted from the antenna 10.

The time-division reception signal inputted from the antenna 10 has the same frequency f1 as the transmission frequency. Thus, the time-division reception signal is branched to the same path as that of the transmission signal through the duplexer 9 and is outputted to the DPD receiver 6 through the circulator 8. The reception signal inputted to the DPD receiver 6 is amplified, frequency down-converted, amplified and converted to a digital signal by the AD converter 3 in the back end. Then, the converted digital signal is outputted to the digital signal processor 1.

The digital signal processor 1 processes each reception signal inputted through the DPD receiver 6.

Further, in the case where the wireless device is operated in the TDD scheme, the receiver 7 may be turned off to achieve lower power consumption since the receiver 7 is not used in the TDD scheme.

As described above, the wireless device according to the first embodiment is configured to support not only FDD wireless communications in which the transmission is performed with the frequency f1 while the reception is performed with the frequency f2, but also TDD wireless communications in which both of the transmission and the reception are performed with the frequency f1. The wireless device includes the transmitter 5 configured to transmit a signal of the first frequency f1, the DPD receiver 6 configured to receive a signal of the first frequency f1, the receiver 7 configured to receive a signal of the second frequency f2, the duplexer 9 (branching unit) that is connected to the antenna 10 and includes a first filter having passband characteristics in a frequency band of the first frequency f1 and a second filter having passband characteristics in a frequency band of the second frequency f2 and the circulator 8 (path switching unit) configured to split the signal from the transmitter 5 to output the split signals to the duplexer 9 and the DPD receiver 6 and output a reception signal from the duplexer 9 to the DPD receiver 6.

The duplexer 9 is connected to the circulator 8 on the first filter side and to the receiver 7 on the second filter side, and uses the DPD receiver 6 for the transmission feedback in the TDD scheme and the FDD scheme and for the reception in the TDD scheme.

With such configuration, it is possible to perform the transmission and reception in the TDD scheme and the FDD scheme while performing a predistortion for the transmission with lower power consumption in multi-level QAM. Therefore, it is possible to provide one common TDD/FDD wireless device for supporting both TDD wireless communications and FDD wireless communications. Further, it is possible to implement the common TDD/FDD wireless device with a simple configuration without the complexity of RF line management and the use of multiple RF switches.

Hereinafter, application examples for improving the TDD and FDD characteristics will be described in detail.

Figure 2:
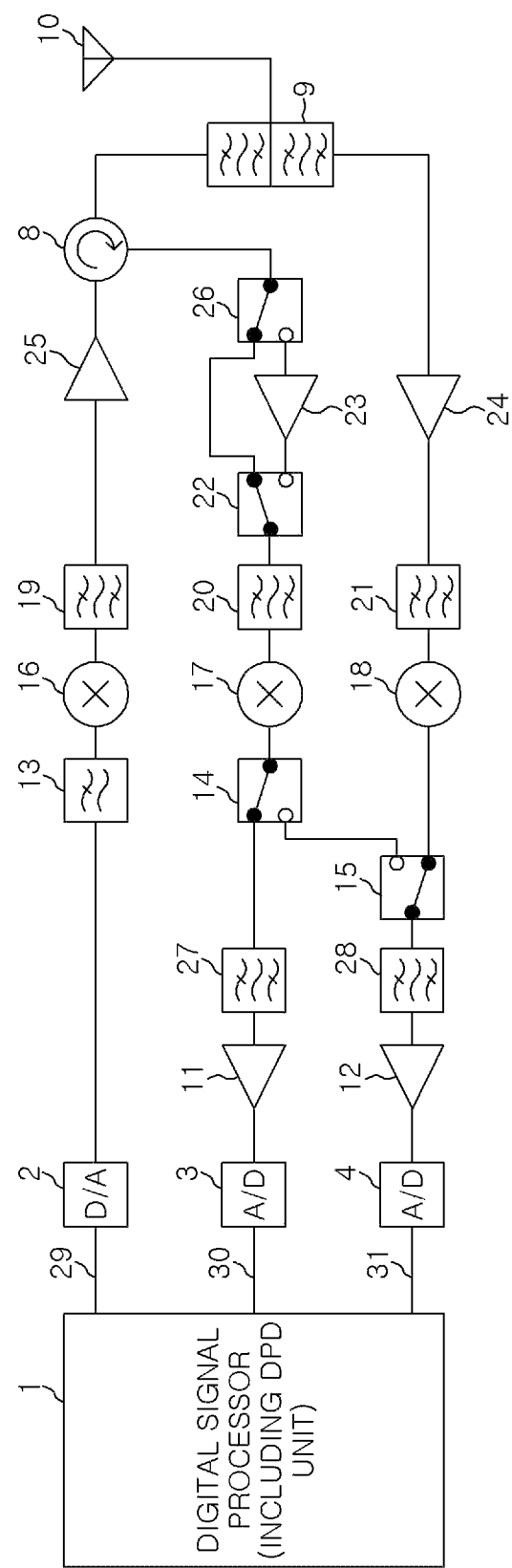
FIG. 2 shows transmission and reception operations of an FDD scheme and a transmission operation of a TDD scheme in the wireless device according to a second embodiment of the present invention.
Figure 3:
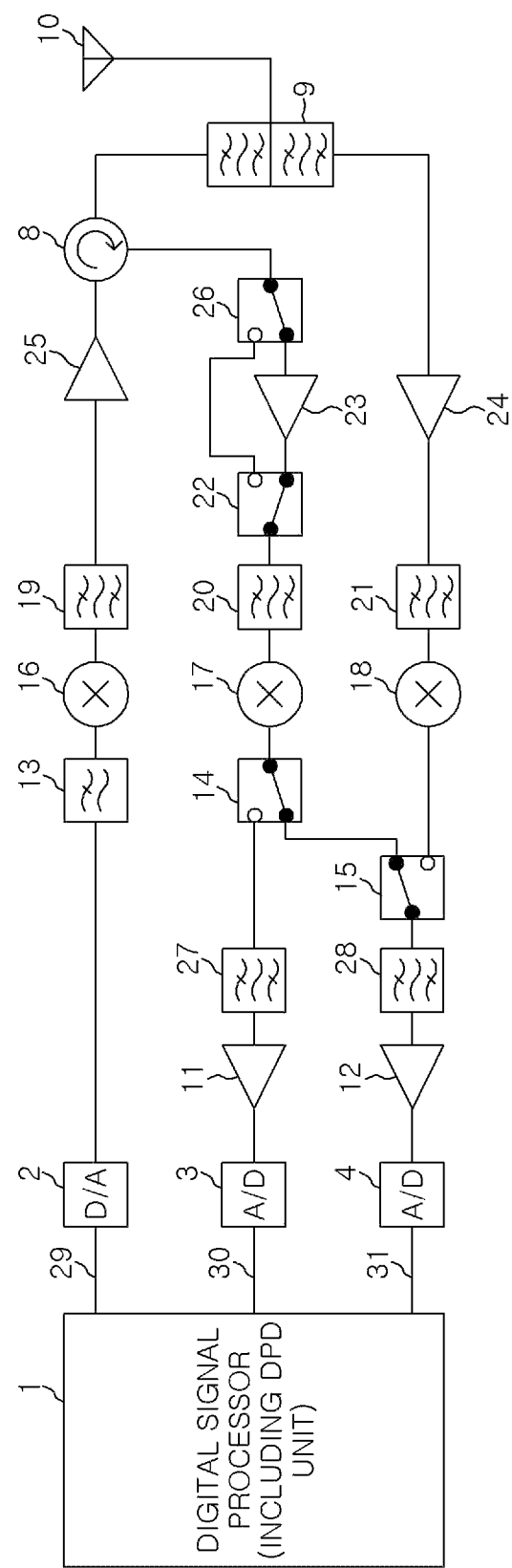
FIG. 3 shows a reception operation of the TDD scheme in the wireless device according to the second embodiment of the present invention.

FIGS. 2 and 3 show an example of a configuration of a wireless device according to a second embodiment of the present invention.

The wireless device of the second embodiment includes the digital signal processor (including the DPD unit) 1, the transmission system 29 having the DA converter 2 and a transmission circuit unit including elements denoted by '13', '16', '19' and '25' shown in FIG. 2, a first reception system 30 having the AD converter 3 and a first reception circuit unit including elements denoted by '26', '23', '22', '20', '17', '14', '27' and '11' shown in FIG. 2, a second reception system 31 having the AD converter 4 and a second reception circuit unit including elements denoted by '24', '21', '18', '15', '28' and '12' shown in FIG. 2, the circulator 8, the duplexer 9, and the antenna 10.

The transmission circuit unit corresponds to the transmitter 5 of the first embodiment and includes a low pass filter 13, a mixer (transmission up-converter) 16, a bandpass filter 19, and a transmission amplifier 25.

The first reception circuit unit corresponds to the DPD receiver 6 of the first embodiment and includes an RF switch 26, a low noise amplifier 23, an RF switch 22, a bandpass filter 20, a mixer (down-converter for digital predistortion) 17, an RF switch 14, and a DPD-band bandpass filter 27 and an IF amplifier 11.

The second reception circuit unit corresponds to the receiver 7 of the first embodiment and includes a low noise amplifier 24, a bandpass filter 21, a mixer (down-converter for reception) 18, an RF switch 15, a reception-band bandpass filter 28 and an IF amplifier 12.

The RF switch 14 is provided to connect the mixer 17 with the DPD-band bandpass filter 27 or connect the mixer 17 with the reception-band bandpass filter 28.

The RF switch 15 is provided to connect the mixer 17 with the reception-band bandpass filter 28 or connect the mixer 18 and the reception-band bandpass filter 28.

The RF switches 22 and 26 are provided to allow or not to allow the low noise amplifier 23 to amplify a signal inputted to the second reception circuit unit.

First, the transmission and reception operation of the FDD scheme by using the wireless device of this embodiment will be described with reference to FIG. 2.

A transmission modulation signal generated by the digital signal processor 1 is converted into an analog signal by the DA converter 2 and, then, passes through a low pass filter 13 for reducing out-of-band noise and spurious noise generated by the DA converter 2. Thereafter, the signal having passed through the low pass filter 13 is up-converted by the mixer 16 in the back end to a desired frequency (frequency f1), passes through the bandpass filter 19 for attenuating out-of-band noise and spurious noise generated by the mixer 16, and is amplified by the transmission amplifier 25 to obtain a required power.

A part of the output signal of the transmission circuit unit is attenuated through the third port (isolated port) of the circulator 8 and is outputted as a feedback signal to the first reception circuit unit. For the transmission and reception in the FDD scheme, the RF switches 22 and 26 are always set so as to allow the signal not to pass through the low noise amplifier 23, and the signal passes through the bandpass filter 20 for attenuating out-of-band noise and spurious noise generated by the mixer 17 in the back end by bypassing the low noise amplifier 23. Thereafter, the signal having passed through the bandpass filter 20 is frequency down-converted. For the transmission and reception in the FDD scheme, the RF switch 14 is always set so as to connect the mixer 17 with the DPD-band bandpass filter 27, and the signal from the mixer 17 passes through the DPD-band bandpass filter 27 to reduce spurious noise and noise out of the DPD-band and is amplified by the IF amplifier 11. Then, the amplified signal is converted to a digital signal by the AD converter 3 in the back end and fed back to the digital signal processor 1.

The digital signal processor 1 controls the DPD unit provided therein to generate a transmission modulation signal having the inverse characteristics of AM/AM (amplitude/amplitude) characteristics and AM/PM (amplitude/phase) characteristics based on the feedback signal fed back through the first reception circuit unit.

As a result, the transmission modulation signal in which non-linear distortion generated due to power amplification in the transmission amplifier 25 is canceled is generated, passes through the circulator 8 and the duplexer 9, and is wirelessly transmitted from the antenna 10.

Meanwhile, since the reception signal inputted from the antenna 10 has the frequency f2 different from the transmission frequency, the reception signal is branched to a path different from that of the transmission signal through the duplexer 9 and is outputted to the second reception circuit unit. The reception signal inputted to the second reception circuit unit is amplified by the low noise amplifier 24, passes through the bandpass filter 21 for attenuating out-of-band noise and spurious noise generated by the mixer 18 in the back end and frequency down-converted by the mixer 18. For the transmission and reception in the FDD scheme, the RF switch 15 is always set so as to connect the mixer 18 with the reception-band bandpass filter 28, and the signal from the mixer 18 passes through the reception-band bandpass filter 28 to reduce spurious noise and noise out of the reception-band and is amplified by the IF amplifier 12. Then, the amplified signal is converted to a digital signal by the AD converter in the back end and is outputted to the digital signal processor 1. The digital signal processor 1 processes each reception signal inputted through the second reception circuit unit.

Next, the transmission operation of the TDD scheme by using the wireless device according to the present embodiment will be described with reference to FIG. 2.

A time-division transmission modulation signal generated by the digital signal processor 1 is converted to an analog signal by the DA converter 2 and, then, passes through a low pass filter 13 for reducing out-of-band noise and spurious noise generated by the DA converter 2. Thereafter, the signal having passed through the low pass filter 13 is up-converted by the mixer 16 in the back end to a desired frequency (frequency f1), passes through the bandpass filter 19 for attenuating out-of-band noise and spurious noise generated by the mixer 16, and is amplified by the transmission amplifier 25 to obtain a required power. During the time when there is no transmission data, the transmission amplifier 25 may be turned off to reduce deterioration of the reception characteristics.

A part of the output signal of the transmission circuit unit is attenuated through the third port (isolated port) of the circulator 8 and is outputted as a feedback signal to the first reception circuit unit. For the transmission and reception in the TDD scheme, during the time when transmission data is present, the RF switches 22 and 26 are always set so as to allow the signal not to pass through the low noise amplifier 23, and the signal passes through the bandpass filter 20 for attenuating out-of-band noise and spurious noise generated by the mixer 17 in the back end by bypassing the low noise amplifier 23. Thereafter, the signal having passed through the bandpass filter 20 is frequency down-converted. For the transmission and reception in the TDD scheme, during the time when transmission data is present, the RF switch 14 is always set so as to connect the mixer 17 with the DPD-band bandpass filter 27, and the signal from the mixer 17 passes through the DPD-band bandpass filter 27 to reduce spurious noise and noise out of the DPD-band and is amplified by the IF amplifier 11. Then, the amplified signal is converted to a digital signal by the AD converter 3 in the back end and fed back to the digital signal processor 1.

The digital signal processor 1 controls the DPD unit provided therein to generate a transmission modulation signal having the inverse characteristics of an AM/AM (amplitude/amplitude) characteristics and an AM/PM (amplitude/phase) characteristics based on the feedback signal fed back through the first reception circuit unit.

As a result, the transmission modulation signal in which non-linear distortion generated due to power amplification in the transmission amplifier 25 is canceled is generated, passes through the circulator 8 and the duplexer 9, and is wirelessly transmitted from the antenna 10.

Next, the reception operation of the TDD scheme by using the wireless device according to the present embodiment will be described with reference to FIG. 3.

A time-division reception signal inputted from the antenna 10 has the same frequency f1 as the transmission frequency. Thus, the time-division reception signal is branched to the same path as that of the transmission signal through the duplexer 9 and is outputted to the first reception circuit unit through the circulator 8. For the transmission and reception in the TDD scheme, during the time when no transmission data is present, the RF switches 22 and 26 are set to allow the signal to pass through the low noise amplifier 23 so that the signal is amplified by the low noise amplifier 23. Thereafter, the amplified signal passes through the bandpass filter 20 for attenuating out-of-band noise and spurious noise generated by the mixer in the back end and is frequency down-converted by the mixer 17. For the transmission and reception in the TDD scheme, during the time when no transmission data is present, the RF switches 14 and 15 are set so as to connect the mixer 17 with the reception-band bandpass filter 28, and the signal from the mixer 17 passes through the reception-band bandpass filter 28 to reduce spurious noise and noise out of the reception-band and is amplified by the IF amplifier 12. Then, the amplified signal is converted to a digital signal by the AD converter 4 in the back end and fed back to the digital signal processor 1.

The digital signal processor 1 processes each reception signal inputted through the first half of the first reception circuit unit and the second half of the second reception circuit unit.

Further, in the case where the wireless device is operated in the TDD scheme, the low noise amplifier 24 and the mixer 18 are not used. Therefore, the low noise amplifier 24 and the mixer 18 may be turned off to achieve the lower power consumption.

As described above, the wireless device according to the second embodiment is configured to support not only FDD wireless communications in which the transmission is performed with the frequency f1 while the reception is performed with the frequency f2, but also TDD wireless communications in which both of the transmission and the reception are performed with the frequency f1. The wireless device includes the transmission circuit unit configured to transmit a signal of the first frequency f1, the first reception circuit unit configured to receive a signal of the first frequency f1, the second reception circuit unit configured to receive a signal of the second frequency f2, the duplexer 9 (branching unit) that is connected to the antenna 10 and includes a first filter having passband characteristics in a frequency band of the first frequency f1 and a second filter having passband characteristics in a frequency band of the second frequency f2, and the circulator 8 (path switching unit) configured to split the signal from the transmission circuit unit to output the split signals to the duplexer 9 and the first reception circuit unit and output a reception signal from the duplexer 9 to the first reception circuit unit.

The duplexer 9 is connected to the circulator 8 on the first filter side and to the second reception circuit unit on the second filter side, and uses the first reception circuit unit for the transmission feedback in the TDD scheme and the FDD scheme and for the reception in the TDD scheme.

More specifically, the first reception circuit unit includes the low noise amplifier 23, the bandpass filter 20, the DPD-band bandpass filter 27 and an IF amplifier 11. The second reception circuit unit includes the low noise amplifier 24, the bandpass filter 21, the reception-band bandpass filter 28 and an IF amplifier 12. The split signal obtained by splitting the signal outputted from the transmission circuit unit to the first reception circuit unit is processed by the bandpass filter 20 and, then, is processed through the DPD-band bandpass filter 27 and the IF amplifier 11. Further, the reception signal of the frequency f1 is processed through the low noise amplifier 23 and the bandpass filter 20 and, then, is processed through the reception-band bandpass filter 28 and the IF amplifier 12. The reception signal of the frequency f2 is processed through the low noise amplifier 24 and the bandpass filter and, then, is processed through the reception-band bandpass filter 28 and the IF amplifier 12.

With such configuration, it is possible to provide one common TDD/FDD wireless device for supporting both TDD wireless communications and FDD wireless communications. Further, it is possible to realize a compact and high-efficiency common TDD/FDD wireless device capable of suppressing deterioration of the wireless communications characteristics in both TDD wireless communications and FDD wireless communications.

Here, the configurations of the device and the system according to the embodiments of the present invention have been presented by way of example only, and are not intended to limit the scope of the invention. Indeed, the embodiments described herein may be embodied in a variety of other forms.

For example, in the above-described embodiments, the duplexer 9 is used as the branching unit according to the present invention. However, other circuit units may be used as long as the circuit unit includes the first filter having passband characteristics in the frequency band of the frequency f1 and the second filter having passband characteristics in the frequency band of the frequency f2.

Further, in the above-described embodiments, the circulator 8 is used as the path switching unit according to the present invention. However, other circuit units may be used as long as the circuit unit is configured to split a signal from the transmission circuit unit to output the split signals to the duplexer 9 and the first reception circuit unit and output a reception signal from the duplexer 9 to the first reception circuit unit.

Furthermore, in the present invention, there may be provided, for example, a method for executing the processes according to the present invention, a program for realizing such a method, a storage medium storing the program and the like.

Industrial Applicability

The present invention can be applied to a low to high power wireless device such as a wireless base station (e.g., a mobile phone base station) in a terminal device, a wireless entrance or the like, and also applied to various TDD and FDD wireless systems from low frequency to millimeter frequency band.

EXPLANATION OF REFERENCE NUMERALS

1: digital signal processor (including DPD unit)
2: DA converter
3, 4: AD converter
5: transmitter
6: DPD receiver for DPD
7: receiver
8: circulator
9: duplexer
10: antenna
11, 12: IF amplifier
13: low pass filter
14, 15, 22, 26: RF switch
16: mixer (transmission up-converter)
17: mixer (down-converter for DPD)
18: mixer (down-converter for reception)
19, 20, 21: bandpass filter
23, 24: low noise amplifier
25: transmission amplifier
27: DPD-band bandpass filter
28: reception-band bandpass filter
29: transmission system
30: first reception system
31: second reception system

What is claimed is:

1. A wireless device compatible with both FDD wireless communications in which a transmission is performed with a first frequency while a reception is performed with a second frequency and TDD wireless communications in which a transmission and a reception are performed with the first frequency, the wireless device comprising:
   a transmission circuit unit configured to transmit a signal having the first frequency;

a first reception circuit unit configured to receive a signal having the first frequency;

a second reception circuit unit configured to receive a signal having the second frequency;

a branching unit connected to an antenna and having a first filter having passband characteristics in a frequency band of the first frequency and a second filter having passband characteristics in a frequency band of the second frequency; and a path switching unit configured to split the signal from the transmission circuit unit to output the split signals to the branching unit and the first reception circuit unit and further configured to output a reception signal from the branching unit to the first reception circuit unit, wherein the branching unit is connected to the path switching unit through the first filter and is also connected to the second reception circuit unit through the second filter, and the branching unit uses the first reception circuit unit for a feedback of the transmission in the TDD wireless communications and the FDD wireless communications and for the reception in the TDD wireless communications.

2. The wireless device of claim 1, wherein the first reception circuit unit includes a first front-end amplifier, a first front-end filter having passband characteristics in the frequency band of the first frequency, a first back-end filter having passband characteristics in a frequency band for distortion compensation, and a first back-end amplifier, the second reception circuit unit includes a second front-end amplifier, a second front-end filter having passband characteristic in the frequency band of the second frequency, a second back-end filter having passband characteristics in a frequency band for the reception, and a second back-end amplifier, the split signal obtained by splitting the signal outputted from the transmission circuit unit to the first reception circuit unit is processed by the first front-end filter and, then, is processed by the first back-end filter and the first back-end amplifier, the received signal having the first frequency is processed by the first front-end amplifier and the first front-end filter and, then, is processed by the second back-end filter and the second back-end amplifier, and the received signal having the second frequency is processed by the second front-end amplifier and the second front-end filter and, then, is processed by the second back-end filter and the second back-end amplifier.

3. A wireless communications method performed by a wireless device compatible with both FDD wireless communications in which a transmission is performed with a first frequency while a reception is performed with a second frequency and TDD wireless communications in which a transmission and a reception are performed with the first frequency, wherein the wireless device includes: a transmission circuit unit configured to transmit a signal having the first frequency; a first reception circuit unit configured to receive a signal having the first frequency; a second reception circuit unit configured to receive a signal having the second frequency; a branching unit connected to an antenna and having a first filter having passband characteristics in a frequency band of the first frequency and a second filter having passband characteristics in a frequency band of the second frequency; and a path switching unit configured to split the signal from the transmission circuit unit to output the split signals to the branching unit and the first reception circuit unit and further configured to output a reception signal from the branching unit to the first reception circuit unit, wherein the branching unit is connected to the path switching unit through the first filter and is also connected to the second reception circuit unit through the second filter, and the branching unit uses the first reception circuit unit for a feedback of the transmission in the TDD wireless communications and the FDD wireless communications and for the reception in the TDD wireless communications.

4. The wireless communications method of claim 3, wherein the first reception circuit unit includes a first front-end amplifier, a first front-end filter having passband characteristics in the frequency band of the first frequency, a first back-end filter having passband characteristics in a frequency band for distortion compensation, and a first back-end amplifier, the second reception circuit unit includes a second front-end amplifier, a second front-end filter having passband characteristic in the frequency band of the second frequency, a second back-end filter having passband characteristics in a frequency band for the reception, and a second back-end amplifier, the split signal obtained by splitting the signal outputted from the transmission circuit unit to the first reception circuit unit is processed by the first front-end filter and, then, is processed by the first back-end filter and the first back-end amplifier, the received signal having the first frequency is processed by the first front-end amplifier and the first front-end filter and, then, is processed by the second back-end filter and the second back-end amplifier, and the received signal having the second frequency is processed by the second front-end amplifier and the second front-end filter and, then, is processed by the second back-end filter and the second back-end amplifier.

* * * * *